(12) United States Patent
Besser et al.

(10) Patent No.: US 6,528,362 B1
(45) Date of Patent: *Mar. 4, 2003

(54) METAL GATE WITH CVD AMORPHOUS SILICON LAYER FOR CMOS DEVICES AND METHOD OF MAKING WITH A REPLACEMENT GATE PROCESS

(75) Inventors: Paul R. Besser, Austin, TX (US); Qi Xiang, San Jose, CA (US); Matthew S. Buynoski, Palo Alto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 94 days.

This patent is subject to a terminal disclaimer.

(21) Appl. No.: 09/691,181

(22) Filed: Oct. 19, 2000

(51) Int. Cl.[7] .............................................. H01L 21/336
(52) U.S. Cl. ...................................... 438/197; 438/199
(58) Field of Search .................................. 438/197, 199

(56) References Cited

U.S. PATENT DOCUMENTS

| | | | | |
|---|---|---|---|---|
| 5,397,909 A | * | 3/1995 | Moslehi ........................ | 257/383 |
| 5,960,270 A | | 9/1999 | Misra et al. ................. | 438/197 |
| 5,966,597 A | * | 10/1999 | Wright ........................ | 438/197 |
| 6,033,963 A | * | 3/2000 | Huang et al. ................ | 257/368 |
| 6,054,355 A | * | 4/2000 | Inumiya et al. .............. | 438/296 |
| 6,258,679 B1 | * | 7/2001 | Burns et al. ................ | 438/303 |
| 6,303,418 B1 | * | 10/2001 | Cha et al. ................... | 438/199 |
| 6,368,950 B1 | * | 4/2002 | Xiang et al. ................ | 438/299 |

OTHER PUBLICATIONS

Ducroquet et al., Full CMP Integration of CVD TiN Damascene Sub–0.1–um Metal Gate Devices for ULSI Applications, IEEE Trans. Electron Devices, 48 (Aug. 2001) 1816.*
Yagishita et al., Improvement of Threshold Voltage Deviation in Damascene Metal Gate Transistors, IEEE Trans. Electron Devices, 48 (Aug. 2001) 1604.*
Inumiya et al., Conformable Formation of High Quality Ultra–Thin Amorphous Ta2O5 Gate Dielectrics Utilizing Water Assisted Deposition (WAD) for Sub 50 nm Damascene Metal Gate MOSFETs, IEDM 2000, 28.4.1.*
Yagashita et al., High Performance Damascene Metal Gate MOSFET's for 0.1 um Regime, IEEE Trans. Electron Devices, 47 (May 2000) 1028.*

* cited by examiner

Primary Examiner—Richard Elms
Assistant Examiner—Christian D. Wilson

(57) ABSTRACT

A semiconductor structure and method for making the same provides a metal gate on a silicon substrate. The gate includes a high dielectric constant on the substrate, and a chemical vapor deposited layer of amorphous silicon on the high k gate dielectric. The metal is then formed on the CVD amorphous silicon layer. The work function of the metal gate is substantially the same as a polysilicon gate due to the presence of the CVD amorphous silicon layer.

10 Claims, 3 Drawing Sheets

METAL GATE WITH CVD AMORPHOUS SILICON LAYER FOR CMOS DEVICES AND METHOD OF MAKING WITH A REPLACEMENT GATE PROCESS

RELATED APPLICATIONS

The present invention contains subject matter similar to that disclosed in U.S. patent application Ser. No. 09/691,224, filed on Oct. 19, 2000, now U.S. Pat. No. 6,392,280; issued May. 21, 2002; U.S. patent application Ser. No. 09/691,259, filed on Oct. 19, 2000, now U.S. Pat. No. 6,440,868; issued Aug. 27, 2002; U.S. patent application Ser. No. 09/691,179, filed on Oct. 19, 2000, now abandoned; and U.S. patent application Ser. No. 09/691,188, filed on Oct. 19, 2000, now U.S. Pat. No. 6,436,840, issued Aug. 20, 2002.

FIELD OF THE INVENTION

The present invention relates to the field of semiconductor processing, and more particularly, to the formation of metallic gate electrodes using the replacement gate process technique.

BACKGROUND OF THE INVENTION

In the integrated circuit (IC) industry, metal-oxide-semiconductor (MOS) transistors have typically been formed utilizing polysilicon gate electrodes. Polysilicon material has been preferred for use as an MOS gate electrode due to its thermal resistive properties (i.e., polysilicon can better withstand subsequent high temperature processing). Polysilicon's robustness during high temperature processing allows polysilicon to be annealed at high temperatures along with source and drain regions. Furthermore, polysilicon's ability to block the ion implantation of doped atoms into a channel region is advantageous. Due to the ion implantation blocking potential of polysilicon, polysilicon allows for the easy formation of self-aligned source and drain structures after gate patterning is completed.

However, polysilicon gate electrodes have certain disadvantages. For example, polysilicon gate electrodes are formed from semiconductor materials that suffer from higher resistivities than most metal materials. Therefore, polysilicon gate electrodes may operate at much slower speeds than gates made of metallic materials. To partially compensate for this higher resistance, polysilicon materials often require extensive and expensive silicide processing in order to increase their speed of operation to acceptable levels.

A need exists in the industry for a metal gate device which can replace a polysilicon gate device. However, metal gates can not withstand the higher temperatures and oxidation ambients which can be withstood by conventional polysilicon gate electrodes. In efforts to avoid some of the concerns with polysilicon gate electrodes, a replacement damascene metal gate process has been created. A damascene gate process uses a disposable gate, which is formed with a source, drain, spacer, etch stops and anti-reflective coatings as in conventional processing. The disposable gate and dielectrics are etched away, exposing an original gate oxide. The disposable polysilicon gate is then replaced by a metal gate to achieve the lower resistivity provided by the metal material.

A design consideration in semiconductor technology is that of the work function, which is the amount of energy required to excite electrons across a threshold. Polysilicon gates on silicon substrates provide a work function that allows the gates to be adequately controlled. The use of metal, however, as the gate material on a silicon substrate undesirably changes the work function in comparison to polysilicon gates. This reduces the controllability of the gate.

SUMMARY OF THE INVENTION

There is a need for a semiconductor structure and arrangement for making the same in which the gate is made of a metal, but the work function is substantially the same as a semiconductor structure which contains a polysilicon gate.

This and other needs are met by the embodiments of the present invention which provide a semiconductor structure comprising a substrate, active regions in the substrate, and a gate structure on the substrate. This gate structure includes a high dielectric constant (high k) gate dielectric on the substrate, a chemical vapor deposited (CVD) layer of amorphous silicon on the high k gate dielectric, and a metal on the CVD amorphous silicon layer.

By providing a semiconductor structure having a gate structure with a CVD layer of amorphous silicon and a metal on the CVD amorphous silicon layer, the advantages of a metal gate, including that of lower resistivity, is achieved without compromising the work function of the gate structure. Hence, the CVD amorphous silicon layer causes the work function of the metal gate to appear like a standard gate.

The earlier stated needs are also met by embodiments of the present invention that provide a method of forming a semiconductor structure, comprising the steps of forming a precursor having a substrate with active regions separated by a channel, and a temporary gate over the channel and between dielectric structures. The temporary gate is removed to form a recess with a bottom and sidewalls between the dielectric structures. Amorphous silicon is deposited in the recess by chemical vapor deposition. The metal is then deposited in the recess on the amorphous silicon.

The formation of a semiconductor structure in accordance with the present invention is advantageous in that high-temperature processes may be performed prior to the deposition of the metal gate. Also, the formation of source and drain electrodes self-aligned to the subsequently formed metal gate is possible. The formation of the metal gate in this replacement gate process, however, allows the metal gate to be formed after the implantation of the dopant atoms. By depositing amorphous silicon in the recess by chemical vapor deposition prior to the depositing of the metal in the recess on the amorphous silicon, the work function will be same as if the gate were made of polysilicon instead of metal. This provides increased control of the gate and avoids leakage.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses and solves problems related to the use of metal gates in semiconductor structures. In conventional semiconductor structures using replacement metal gates, the work function has changed due to the use of metal on a silicon substrate. The present invention provides a work function that is at least substantially the same as the work function of a polysilicon gate on a silicon substrate. This is achieved by providing a chemically vapor deposited amorphous silicon layer over the silicon substrate. The metal of the gate structure is deposited on the amorphous silicon. The presence of the amorphous silicon between the metal gate and the silicon substrate causes the work function to be substantially the same as the work function of a polysilicon gate on a silicon substrate. At the same time, however, the resistance of the gate is reduced due to the replacement of the polysilicon gate with the metal gate structure.

Figure 1:
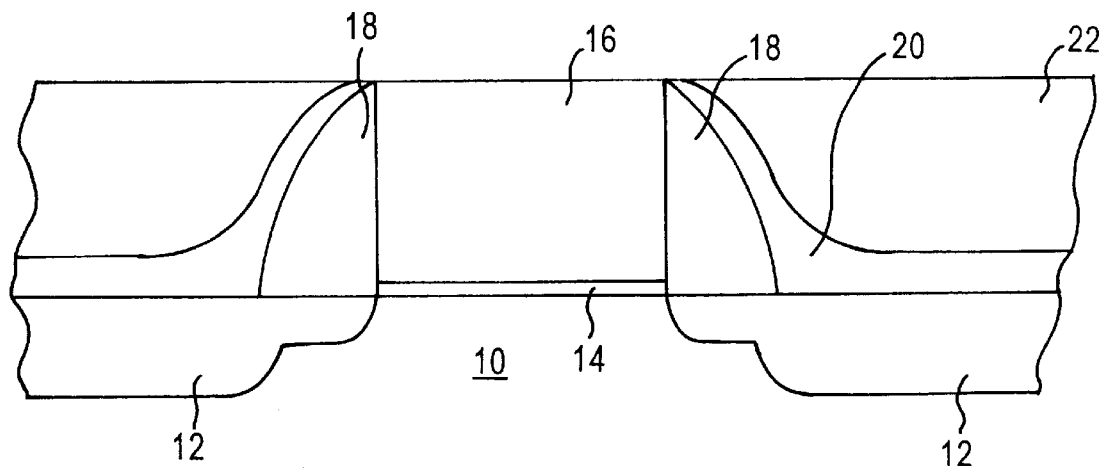
FIG. 1 is a schematic depiction of a cross-section of a semiconductor structure precursor in accordance with embodiments of the present invention.

FIG. 1 is a cross-section of a precursor for the semiconductor structure constructed in accordance with embodiments of the present invention. In the following description, the features in the drawings are not necessarily represented accurately in terms of relative sizes or shapes, but have been rendered for illustrative purposes.

In FIG. 1, the silicon substrate 10 has active regions 12 formed therein by conventional doping techniques. A gate oxide 14 has been provided on the surface of the substrate 10. A polysilicon gate 16, which serves as a temporary (or "dummy") gate is provided on top of the gate oxide 14.

Spacers 18 are provided on the sidewalls of the gate 16. The sidewalls 18 may be made of material, such as silicon nitride, silicon oxide, silicon oxynitride, or different layers thereof. Layer 20 is an etch stop layer and/or a bottom anti-reflective coating (BARC) layer. A dielectric layer 22 is provided on top of the BARC layer 20. The semiconductor structure of FIG. 1 has been planarized, by chemical mechanical planarization (CMP), for example, to provide a planarized upper surface.

The structure of FIG. 1 is a conventional semiconductor structure with active regions and a polysilicon gate. In order to provide a gate with reduced resisitivity, however, the polysilicon gate 16 may be removed and replaced by a metal gate, as provided for in the present invention. As noted earlier, however, the use of a metal gate structure undesirably changes the work function of the gate. This is avoided in the present invention by the use of a chemical vapor deposited amorphous silicon layer.

Figure 2:
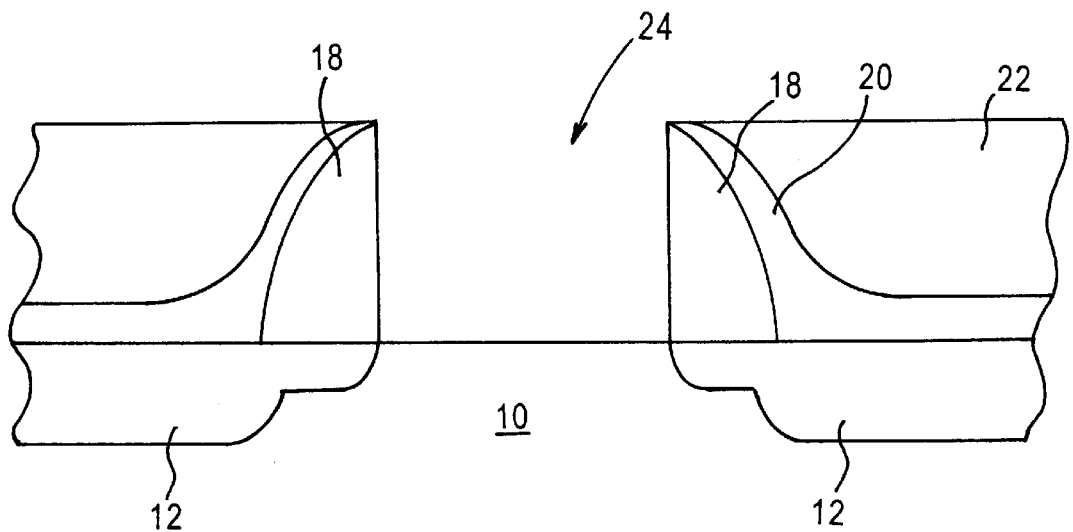
FIG. 2 depicts the structure of FIG. 1 after the dummy gate and the gate dielectric have been removed.

In FIG. 2, the polysilicon gate 16 and gate oxide 14 have been removed from the region between spacers 18. This leaves a recess 24 bounded by the top of the substrate 10 and the sidewalls formed by the spacers 18. A plasma reactive ion etch (RIE) using chlorine or a wet polysilicon etch using conventional etch chemistry may be utilized to remove the polysilicon layer to form the opening (i.e. recess) 24.

Figure 3:
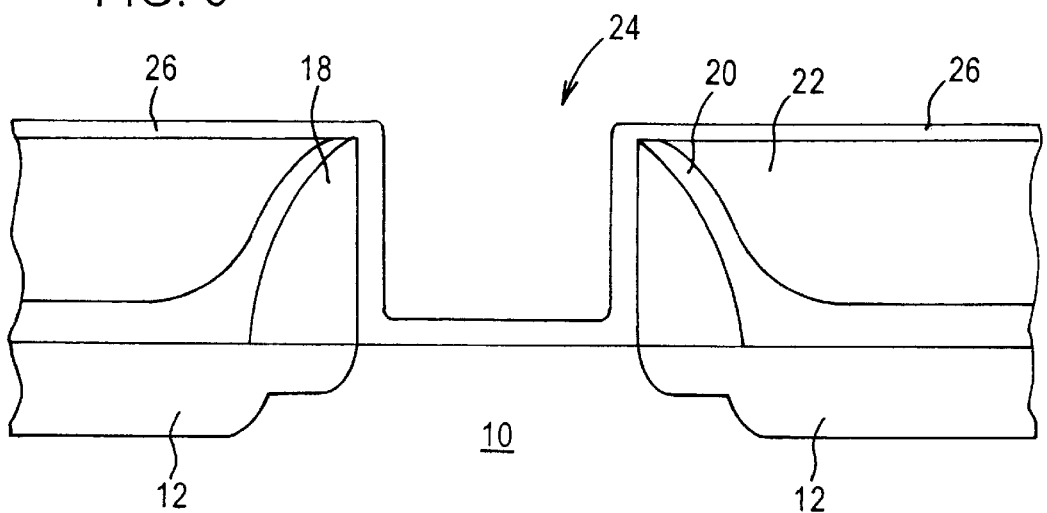
FIG. 3 shows the semiconductor structure of FIG. 2 after a high k dielectric has been deposited.

In FIG. 3, a high k dielectric is provided as layer 26 within the recess 24. The high k gate dielectric 26 can provided in a layer having a thickness between about 15 and about 200 Angstroms thick, for example. Conventional methods of deposition, such as chemical vapor deposition, may be used to deposit the high k gate dielectric layer 26. Typical materials that may be used in the high k gate dielectric layer 26 include $ZrO_2$, $HfO_2$, $InO_2$, $LaO_2$, $TaO_2$, for example. Other multiple metal oxides may be used or perovskites may be employed as the high k gate dielectric material in layer 26.

A reason for using high k material as a gate dielectric is that it provides better electrical coupling with the gate and the channel. Furthermore, silicon dioxide is no longer extendible. Tunneling leakage is an important consideration. With high k material, a thicker film can be used while still obtaining the same electric field. One of the concerns with high k material, however, is its low temperature stability. In other words, at high temperatures, high k materials react with the silicon substrate. Processing at lower temperatures, such as with nickel silicide, mitigate this concern.

Figure 4:
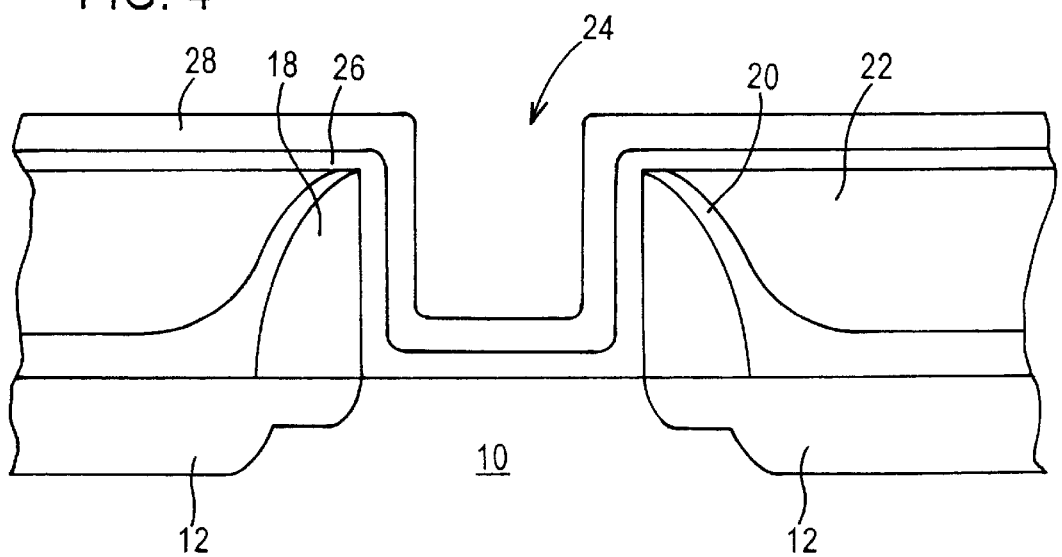
FIG. 4 depicts the semiconductor structure of FIG. 3 following the chemical vapor deposition of amorphous silicon over the high k gate dielectric.

FIG. 4 depicts the semiconductor structure of FIG. 3 after the deposition of an amorphous silicon layer 28. The amorphous silicon layer 28 is provided within the recess 24 on top of the high k gate dielectric layer 26. In the present invention, the amporhous silicon layer 28 is deposited by chemical vapor deposition or plasma enhanced chemical vapor deposition. Hence, the layer 28 is a CVD amorphous silicon layer or a PECVD amorphous silicon layer.

A conventional chemical vapor deposition or plasma enhanced chemical vapor deposition process may be used to deposit the amorphous silicon layer 28. As an example, the amorphous silicon is normally deposited at temperatures less than 550° C. Deposition is from a pure silane gas, i.e. with no additives or carriers. A pressure in the deposition chamber is maintained between about 100 to about 400 mT. The temperature is controlled between about 520 and about 550° C. The deposition rate is between about 10 to about 20 Å/second. A thickness of the amorphous silicon layer 28 is between approximately 50 and approximately 500 Angstroms in certain preferred embodiments, and between approximately 50 and approximately 200 Angstroms in especially preferred embodiments. Such thicknesses are typically used when the final gate structure is between approximately 1000 and approximately 2000 Angstroms high. One of the advantages of CVD and PECVD deposition is the substantially uniform thickness provided on the sidewalls and bottom of the recess 24 due to the excellent step coverage of the CVD and the PECVD processes.

In certain embodiments of the invention, phosphine and BF2 are added to the silane gas to dope the CVD amorphous silicon layer to lower the resistivity of the CVD amorphous silicon layer.

Following the deposition of the CVD amorphous silicon layer 28, a metal layer 30 is deposited over the amorphous silicon layer 28. The deposition may take place by chemical vapor deposition, for example. The use of a CVD deposition of the amorphous silicon, followed by the CVD deposition of the metal 30, allows both processes to be performed in situ so that the semiconductor structure does not have to be removed from the deposition chamber between the different deposition processes. This reduces processing time and handling of the wafer.

The metal that is deposited in metal layer 30 may be any of a number of different types of metals, such as tungsten, titanium, molybdenum, nickel, etc. The CVD deposition of the metal layer 30 is achieved by conventional deposition techniques.

Figure 5:
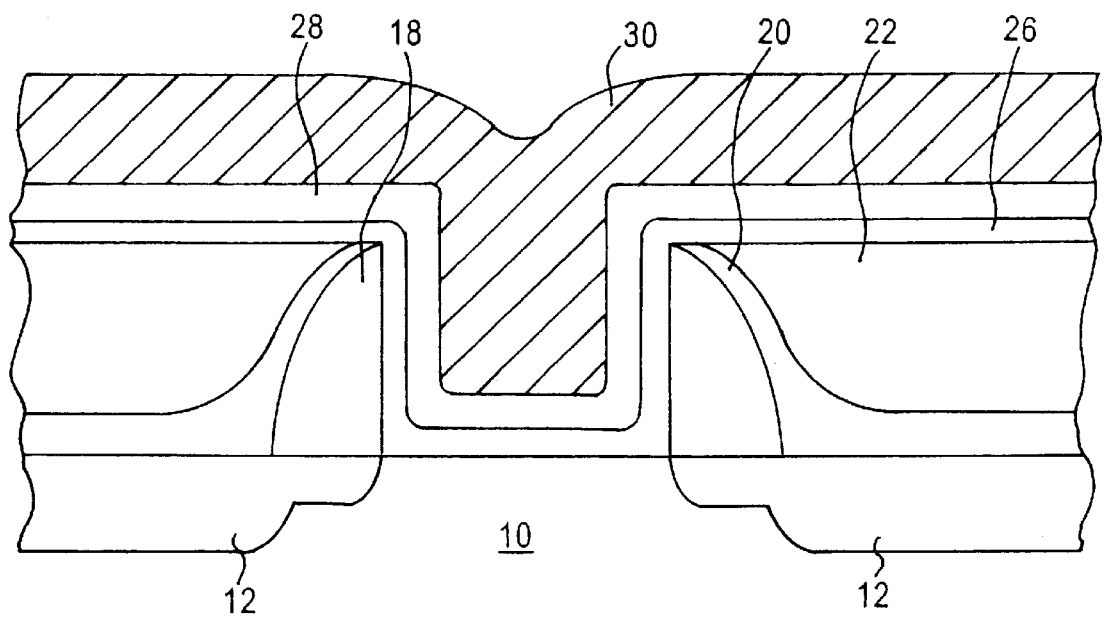
FIG. 5 illustrates the semiconductor structure of FIG. 4 after a metal has been deposited within the recess in accordance with the embodiments of the present invention.
Figure 6:
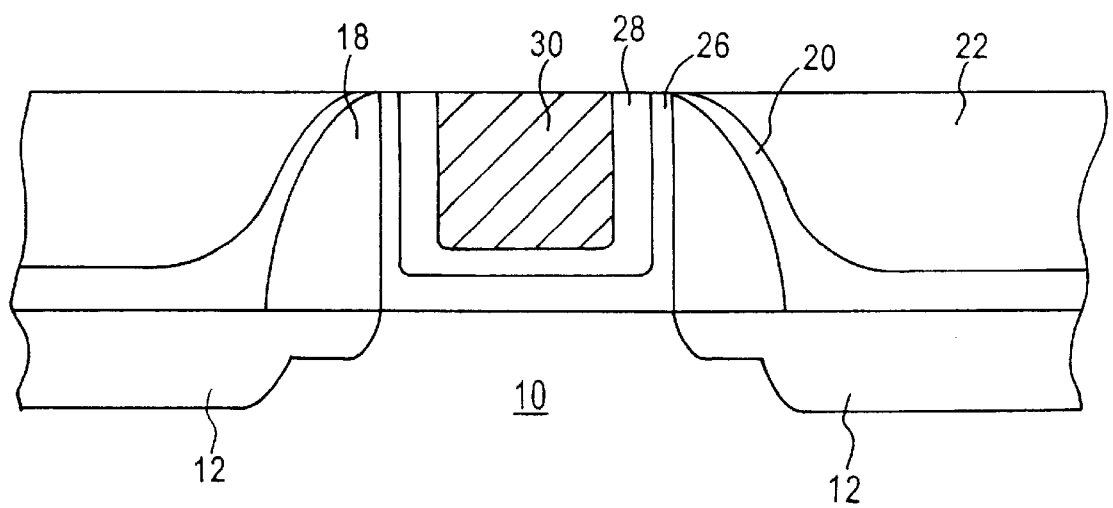
FIG. 6 is a cross-section of the semiconductor structure of FIG. 5 after a planarizing procedure has been performed.

In FIG. 6, the semiconductor structure of FIG. 5 has been planarized, by chemical mechanical planarization, for example. This presents a smooth, top surface suitable for further processing. The semiconductor structure now has a complete replacement gate electrode comprising the high k gate dielectric 26, the CVD amorphous silicon 28 and the metal 30.

The gate structure depicted in FIG. 6 exhibits the lower resisitivity provided by a metal gate, but does not have a changed work function in comparison to a polysilcon gate due to the presence of the CVD amorphous silicon layer 28. By providing the CVD amorphous silicon layer within the gate structure, between the metal and silicon substrate, the gate structure appears electrically like a polysilicon gate. Control of the gate is therefore improved over conventional metal gates. The method of forming the metal gate in accordance with the present invention ensures that the metal on the gate is not subjected to high temperature processing.

Although the present invention has been described and illustrated in detail, it is to be clearly understood that the same is by way of illustration and example only is not to be taken by way of limitation, scope of the present invention by limited only by the terms the appended claims.

What is claimed is:

1. A method of forming a semiconductor structure, comprising the steps of:

forming a precursor having a substrate with active regions separated by a channel, and a temporary gate over the channel and between dielectric structures;

removing the temporary gate to form a recess with a bottom and sidewalls between the dielectric structures;

depositing amorphous silicon in the recess by chemical vapor deposition; and depositing a metal in the recess on the amorphous silicon.

2. The method of claim 1, further comprising forming a high k gate dielectric layer in the recess prior to depositing the amorphous silicon in the recess.

3. The method of claim 2, wherein the thickness of the amorphous silicon is between approximately 50 and approximately 500 Angstroms.

4. The method of claim 2, wherein the thickness of the amorphous silicon is between approximately 50 and 200 Angstroms.

5. The method of claim 1, wherein the amorphous silicon and the metal are formed in situ in a single deposition chamber.

6. The method of claim 1, wherein the chemical vapor deposition is a plasma enhanced chemical vapor deposition.

7. The method of claim 1, wherein further processing of the semiconductor structure is maintained below a temperature sufficient to prevent substantial silicidation of the amorphous silicon in the recess.

8. The method of claim 7, wherein the temperature is 700° C.

9. The method of claim 1, wherein the dielectric structures are spacers.

10. The method of claim 1, wherein the metal comprises one of Mo, W, Ti, and Ni.

* * * * *